United States Patent
Zhang

(10) Patent No.: US 11,347,284 B2
(45) Date of Patent: May 31, 2022

(54) WATER COOLING RADIATOR WITH A DETACHABLE WATER PUMP AND A BUILT-IN FAN

(71) Applicant: DONGGUAN BINGDIAN INTELLIGENT SCIENCE & TECHNOLOGY CO., LTD., Dongguan (CN)

(72) Inventor: Fengqi Zhang, Tongliao (CN)

(73) Assignee: DONGGUAN BINGDIAN INTELLIGENT SCIENCE & TECHNOLOGY CO., LTD., Dongguan (CN)

( * ) Notice: Subject to any disclaimer, the term of this patent is extended or adjusted under 35 U.S.C. 154(b) by 168 days.

(21) Appl. No.: 17/012,039

(22) Filed: Sep. 3, 2020

(65) Prior Publication Data
US 2020/0401198 A1    Dec. 24, 2020

(30) Foreign Application Priority Data
Aug. 12, 2020 (CN) .......................... 202010808717.4

(51) Int. Cl.
*G06F 1/20* (2006.01)
*H05K 7/20* (2006.01)
(Continued)

(52) U.S. Cl.
CPC .......... *G06F 1/20* (2013.01); *H05K 7/20136* (2013.01); *H05K 7/20218* (2013.01);
(Continued)

(58) Field of Classification Search
CPC .......... H05K 7/20136; H05K 7/20145; H05K 7/20154; H05K 7/20254; G06F 1/20; G06F 2200/201
See application file for complete search history.

(56) References Cited

U.S. PATENT DOCUMENTS

| 6,343,478 B1 * | 2/2002 | Chang | H01L 23/473 257/E23.098 |
| 7,224,585 B2 * | 5/2007 | Lee | H01L 23/473 257/E23.098 |

(Continued)

FOREIGN PATENT DOCUMENTS

| CN | 106888565 A * | 6/2017 | ......... H05K 7/20145 |
| KR | 200314041 Y1 * | 5/2003 | ......... H05K 7/20145 |

OTHER PUBLICATIONS

KR-200314041 English Translation EPO (Year: 2003).*
CN-106888565 English Translation EPO (Year: 2017).*

*Primary Examiner* — Eric S Ruppert
*Assistant Examiner* — Christopher C Pillow

(57) ABSTRACT

The present application provides a novel water cooling radiator with a detachable water pump and a built-in fan, which enables outside air to enter a cooling housing from air inlet holes in an upper end of the cooling housing and be discharged from air outlet holes in a lower end of the cooling housing, so that the air discharged from the air outlet holes can dissipate heat from and cool down various electronic components such as MOS tubes and memory chips around the motherboard and CPU, thereby improving the heat dissipation efficiency and prolonging the service life of the motherboard. A pump is connected externally to the radiator, which makes the installation and connection more convenient and the performance better.

9 Claims, 5 Drawing Sheets

(51) Int. Cl.
*F21Y 115/10* (2016.01)
*F28D 21/00* (2006.01)

(52) U.S. Cl.
CPC ...... H05K 7/20254 (2013.01); *F21Y 2115/10* (2016.08); *F28D 2021/0031* (2013.01); *G06F 2200/201* (2013.01)

(56) References Cited

U.S. PATENT DOCUMENTS

| | | | | |
|---|---|---|---|---|
| 7,359,197 | B2* | 4/2008 | Stefanoski | H05K 7/20772 |
| | | | | 361/689 |
| 2005/0230086 | A1* | 10/2005 | Wang | H01L 23/473 |
| | | | | 257/E23.098 |
| 2007/0089859 | A1* | 4/2007 | Wei | H01L 23/473 |
| | | | | 257/E23.098 |
| 2010/0328887 | A1* | 12/2010 | Refai-Ahmed | H01L 23/467 |
| | | | | 165/185 |
| 2012/0211204 | A1* | 8/2012 | Agonafer | H01L 23/38 |
| | | | | 165/104.34 |

* cited by examiner

WATER COOLING RADIATOR WITH A DETACHABLE WATER PUMP AND A BUILT-IN FAN

TECHNICAL FIELD

The present invention relates to the field of water cooling heat dissipation, and in particular to a novel water cooling radiator with a detachable water pump and a built-in fan.

BACKGROUND

Nowadays, with the rapid development of electronic technology and people's needs in life, entertainment and work, computers have become essential daily necessities in people's daily life. People cannot work or entertain themselves without computers most of the time. With the rapid development of electronic technology, the performance of computers has also been rapidly improved. However, the improvement of performance is accompanied by the increase of heat produced, which has a serious impact on the performance and service life of computers.

Existing heat dissipation systems mainly include an air cooling heat dissipation system and a water cooling heat dissipation system, of which the water cooling heat dissipation system has been widely applied in heat dissipation for CPU because of its remarkable heat dissipation performance and low noise, and has become one of the important development trends of computer cooling systems.

However, the water cooling heat dissipation systems in the prior art carry out a water cooling treatment simply through water passages, which may easily cause poor heat dissipation effect and low heat dissipation efficiency. Moreover, existing water cooling radiators are provided with a pump therein, which makes the installation and maintenance very inconvenient. In addition, the existing water cooling radiators can only dissipate heat from the CPU, but cannot dissipate heat from and cool down various electronic components such as MOS tubes and memory chips around the CPU.

SUMMARY

In order to solve the above problems, the present application provides a novel water cooling radiator with a detachable water pump and a built-in fan, which can simultaneously dissipate heat from and cool down the CPU and the surroundings of the motherboard and CPU, thus prolonging the service life of the motherboard. At the same time, the pump in the present application is connected externally to the radiator, which makes the installation, connection and maintenance more convenient and the performance better. Moreover, the built-in water cooling fan is more efficient and practical for the whole heat dissipation performance of the motherboard.

To achieve the above objectives, a technical solution employed in the present application is as follows: a novel water cooling radiator with a detachable water pump and a built-in fan is provided, including a liquid inlet pipe, a liquid outlet pipe, a pump, a cooling unit, a cooling fan unit and a heat absorbing unit tightly attached to a cooling surface of a processor, wherein the heat absorbing unit is internally provided with a heat absorbing cavity, as well as a liquid inlet pipe orifice and a liquid outlet pipe orifice which are communicated with the heat absorbing cavity; the cooling unit is communicated with the liquid inlet pipe orifice of the heat absorbing unit through the liquid inlet pipe, the liquid outlet pipe orifice of the heat absorbing unit is connected to an input end of the liquid outlet pipe through the pump, and an output end of the liquid outlet pipe is communicated with the cooling unit; the cooling fan unit includes a fan main body and a cylindrical cooling housing sleeved on the heat absorbing unit, wherein several air inlet holes are formed in an outer side wall at an upper end of the cooling housing along a circumferential direction while several air outlet holes are formed in an outer side wall at a lower end of the cooling housing along the circumferential direction; and the cooling housing is sleeved on the heat absorbing unit, and the fan main body is disposed on the surface of the heat absorbing unit and located between the height of the air inlet holes and the height of the air outlet holes.

Preferably, a first notch corresponding to the liquid outlet pipe orifice and a second notch corresponding to the liquid inlet pipe orifice are disposed at the lower end of the cooling housing; the cooling housing is sleeved on the surface of the heat absorbing unit, the first notch is sleeved at the liquid outlet pipe orifice, and the second notch is sleeved at the liquid inlet pipe orifice.

Preferably, the fan main body includes fan blades, a drive motor and a cylindrical fan mounting sleeve; the drive motor is in drive connection with the fan blades and drives the fan blades to rotate, and a mounting bracket, on which the drive motor is assembled, is disposed at a lower end of the fan mounting sleeve; several connecting columns each having a first screw hole formed in its upper end, are disposed on the surface of the heat absorbing unit, and second screw holes aligned with the first screw holes are formed in the mounting bracket; and the fan mounting sleeve is placed on the surface of the heat absorbing unit and passes through the first screw hole and the second screw hole respectively through screws, so as to be assembled with the heat absorbing unit.

Preferably, several support columns, top ends of which are propped against an bottom wall of the mounting bracket, are further disposed on the surface of the heat absorbing unit, and the fan mounting sleeve is placed on the surface of the heat absorbing unit.

Preferably, an LED light module, consisting of a red LED light, a blue LED light, a green LED light and a white LED light, is disposed on an inner wall of the fan mounting sleeve.

Preferably, an opening, which is covered and closed by a cover plate made of transparent material, is formed at an upper end of the cooling housing.

Preferably, a lug boss, on a top wall of which the cover plate is placed, is disposed around an inner wall of the opening.

Preferably, the radiator further includes a first connector, a second connector, a first pipe sleeve and a second pipe sleeve, wherein the first connector is assembled at the liquid outlet pipe orifice, and the second connector is assembled at the liquid inlet pipe orifice; the first connector is communicated with the input end of the liquid outlet pipe through the first pipe sleeve, an output end of the liquid outlet pipe is communicated with a water inlet end of the pump, and a water outlet end of the pump is communicated with the cooling unit; and the cooling unit is communicated with an input end of the liquid inlet pipe, and the second connector is communicated with an output end of the liquid inlet pipe through the second pipe sleeve.

Preferably, the radiator further includes a pump casing, wherein the pump casing includes an upper casing and a lower casing, the pump is located in a cavity defined by the upper casing and the lower casing, and the liquid inlet pipe is communicated with the cooling unit after passing through the cavity.

The present invention has the beneficial effects that:

1. While maintaining the most basic water cooling effect, the radiator according to the present application is further provided with a cooling fan unit, wherein several air inlet holes are formed in the outer side wall at the upper end of the cooling housing along the circumferential direction and several air outlet holes are formed in the outer side wall at the lower end of the cooling housing along the circumferential direction; and the cooling housing is sleeved on the heat absorbing unit, and the fan main body is disposed on the surface of the heat absorbing unit and located between the height of the air inlet holes and the height of the air outlet holes. Therefore, the radiator enables outside air to enter the cooling housing from the air inlet holes at the upper end of the cooling housing and be discharged from the air outlet holes at the lower end of the cooling housing. As the heat absorbing unit is tightly attached to the cooling surface of a CPU when in operation, the air discharged from the air outlet holes can dissipate heat from and cool down various electronic components such as MOS tubes and memory chips around the motherboard and CPU. By using the radiator according to the present application, the CPU and various electronic components such as MOS tubes and memory chips around it can be simultaneously cooled down, which can greatly improve the heat dissipation efficiency and prolong the service life of the motherboard.

2. According to the present application, the pump is disposed between the cooling unit and the liquid outlet pipe. Compared with the traditional pump built in the heat absorbing unit, the pump in the present application is connected externally to the radiator, which makes the installation, connection and maintenance more convenient and the performance better.

Figure 1:
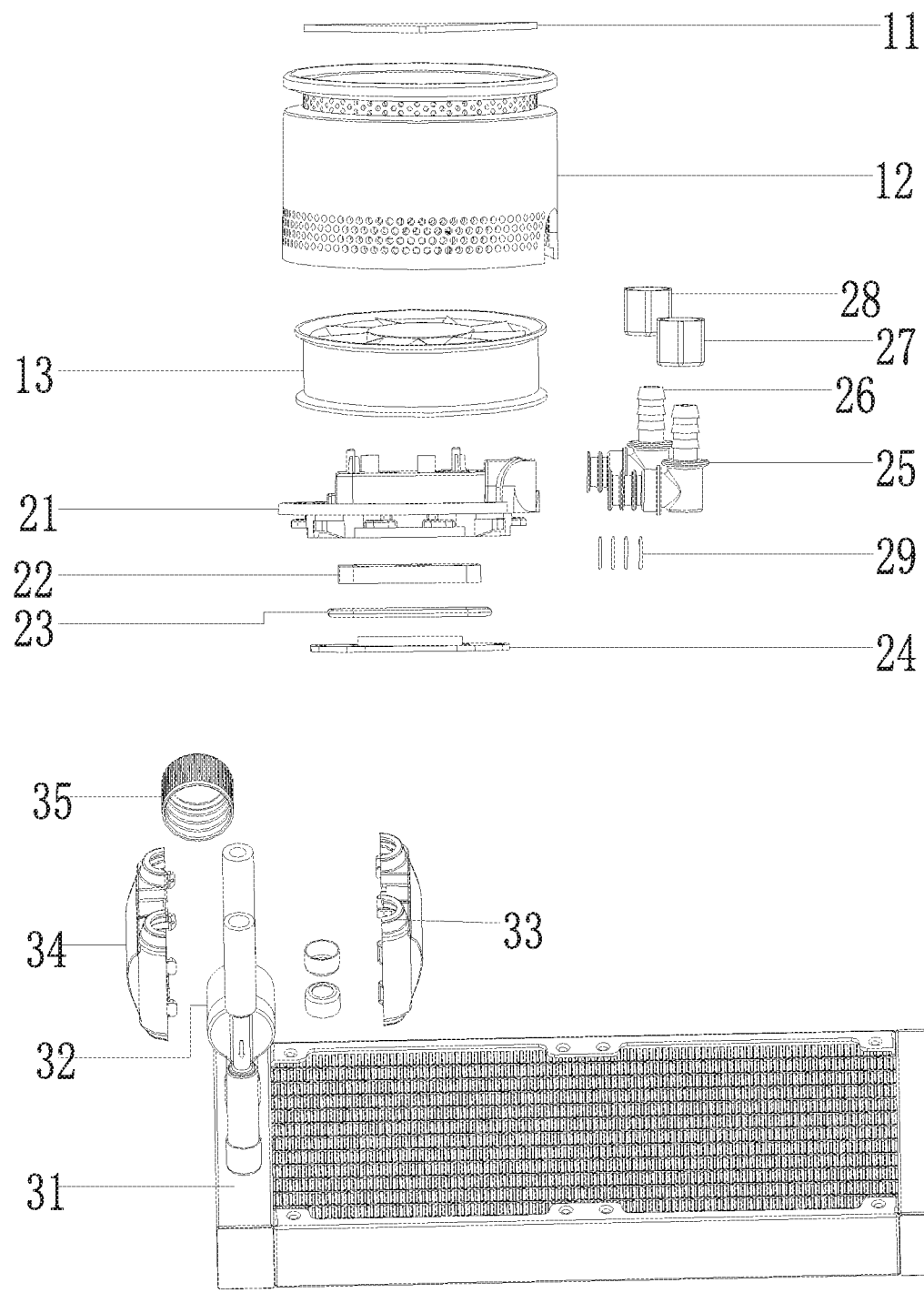
FIG. 1 is an exploded view of an entire radiator according to the present application.
Figure 2:
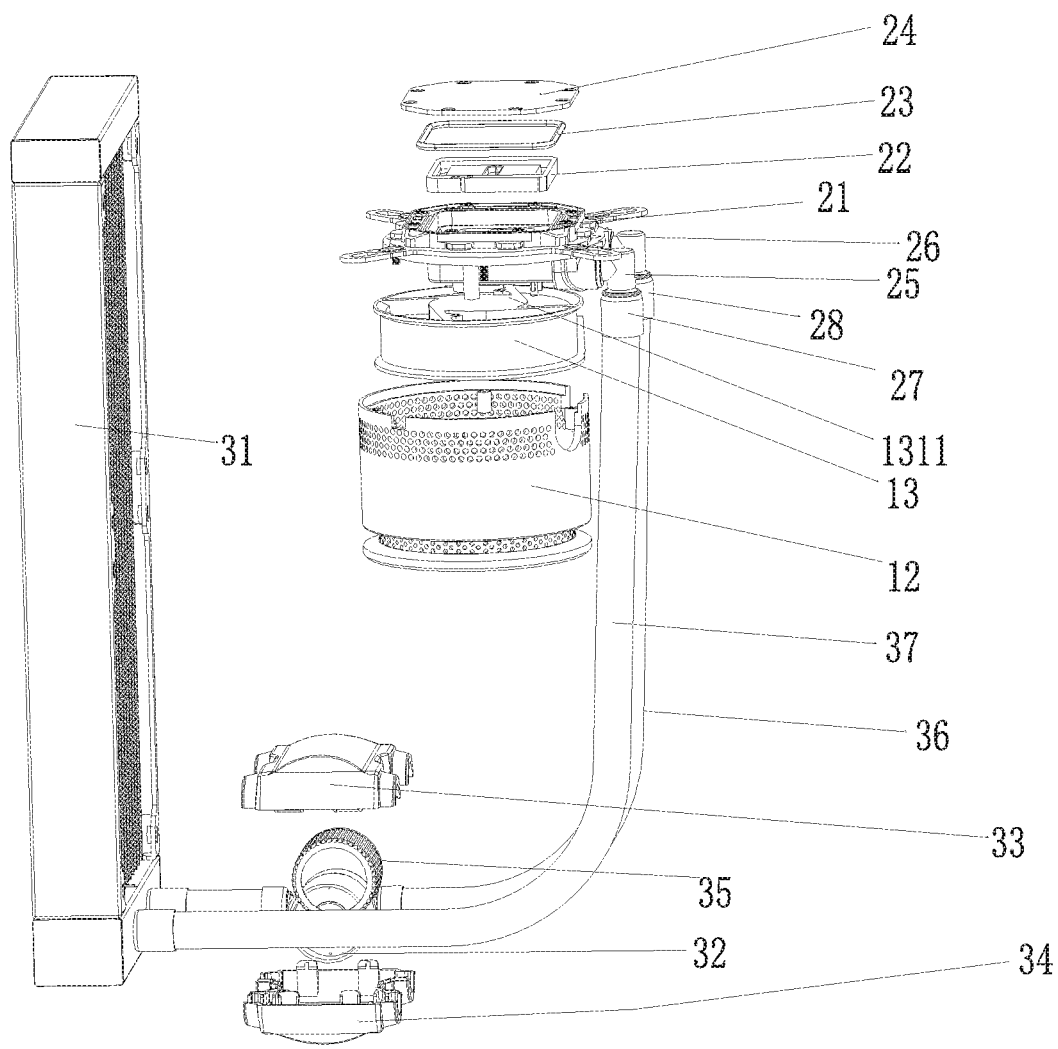
FIG. 2 is an exploded view of the entire radiator according to the present application.
Figure 3:
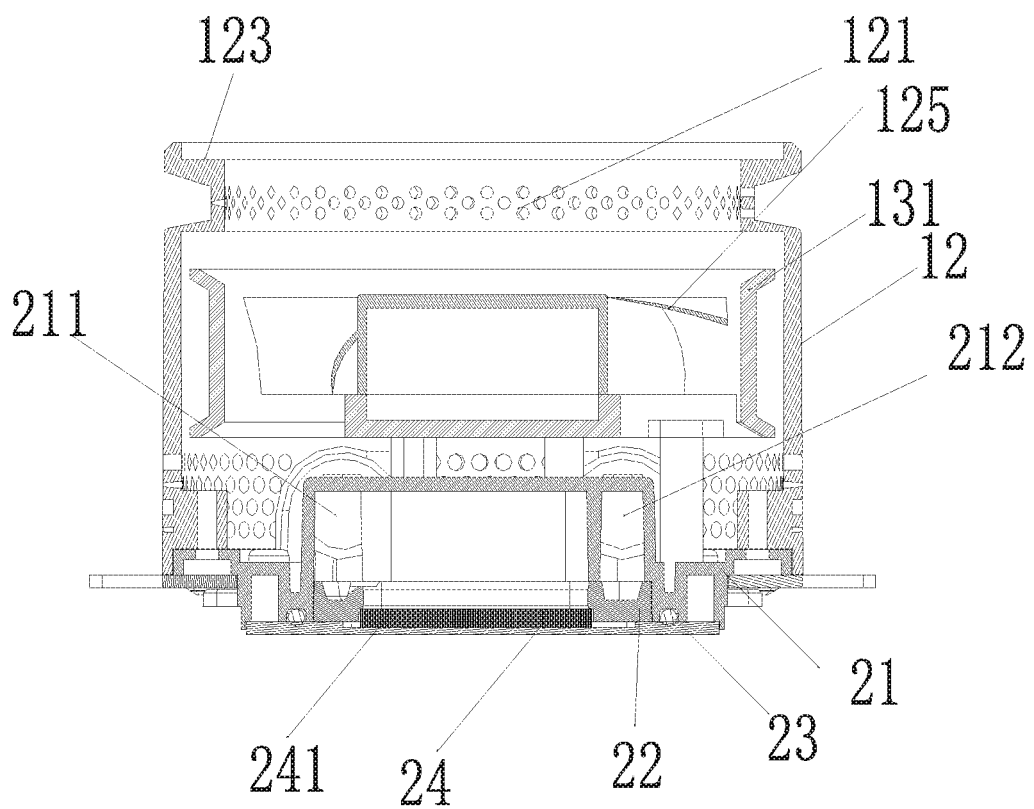
FIG. 3 is a sectional view along a space axis XZ after a heat absorbing unit and a cooling fan unit are assembled according to the present application.
Figure 4:
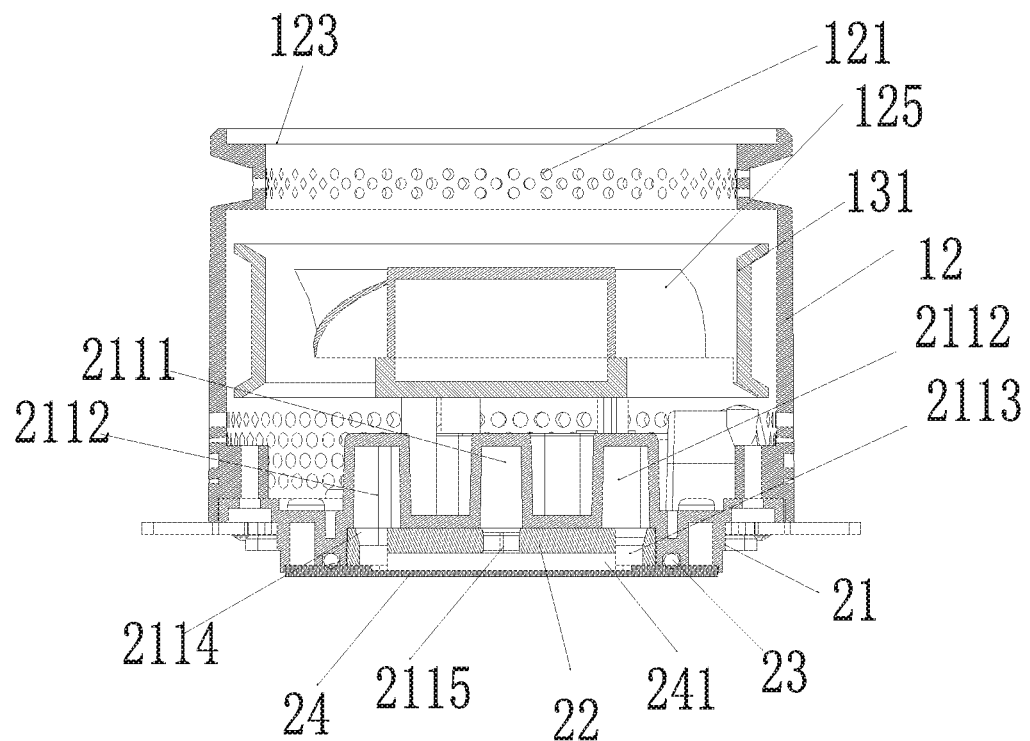
FIG. 4 is a sectional view along an axis YZ after the heat absorbing unit and the cooling fan unit are assembled according to the present application.
Figure 5:
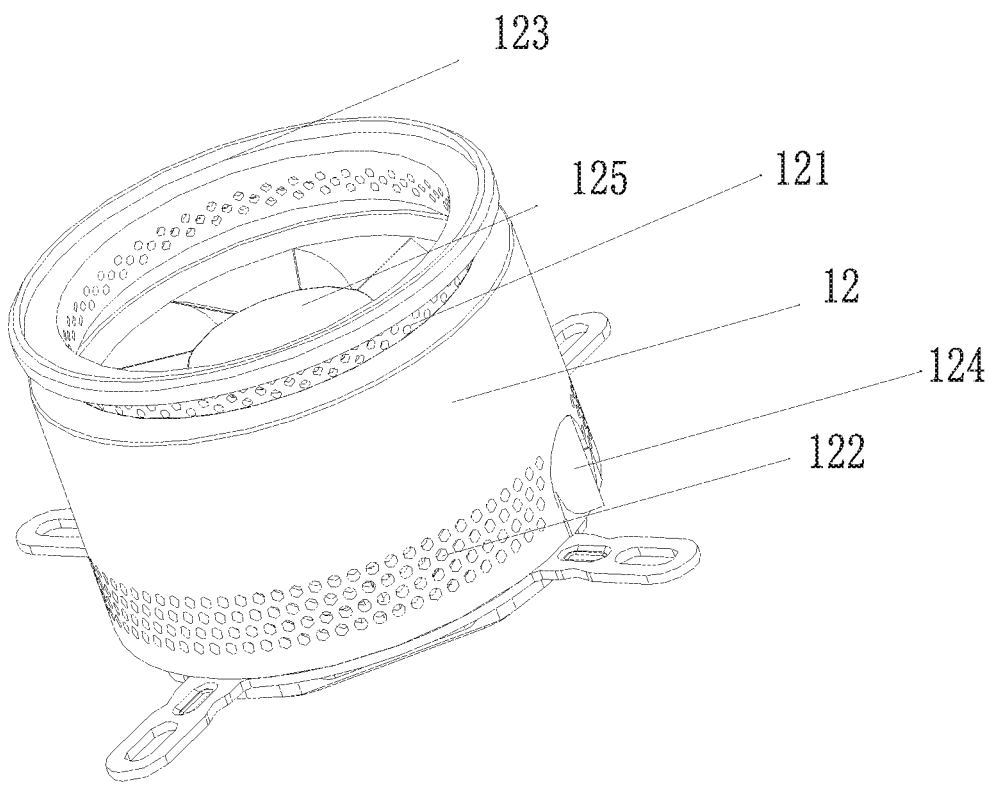
FIG. 5 is a three-dimensional structural diagram after the heat absorbing unit and the cooling fan unit are assembled according to the present application.
Figure 6:
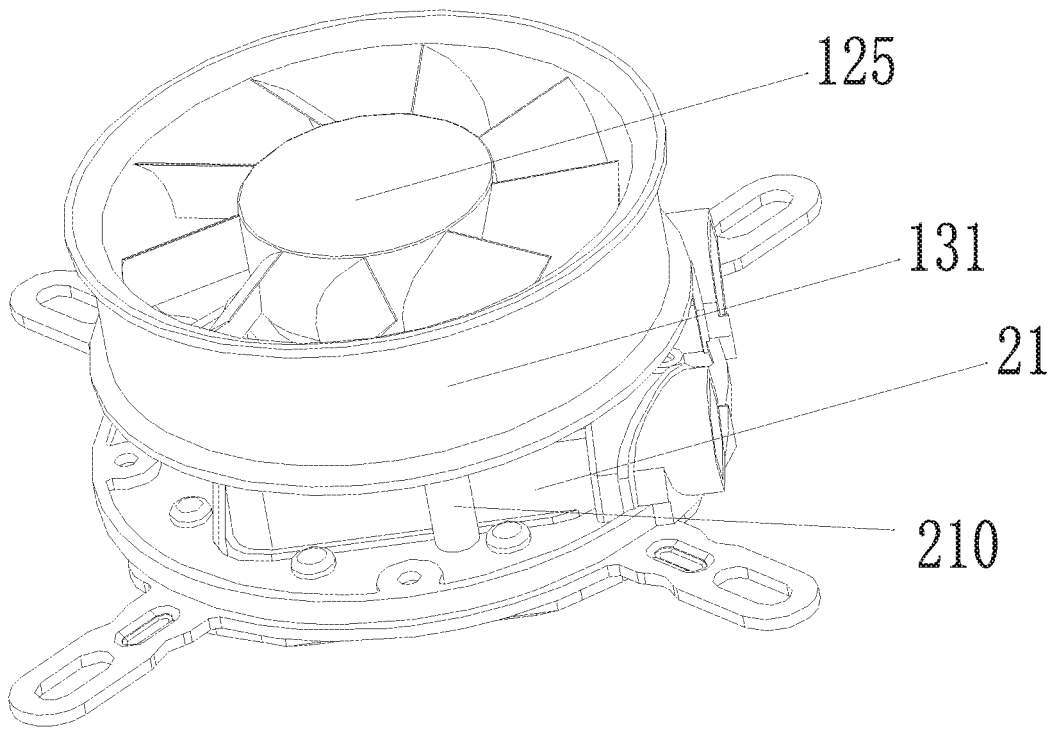
FIG. 6 is a structural diagram of FIG. 5 without a cooling housing.

in which:

11: cover plate; 12: cooling housing; 121: air inlet; 122: air outlet; 123: lug boss; 124: first notch; 125: fan blade; 13: fan body; 131: fan mounting sleeve; 1311: mounting bracket; 21: bottom case; 210: support column; 211: liquid outlet pipe orifice; 212: liquid inlet pipe orifice; 2111: first water cavity; 2112: second water cavity; 2113: third water cavity; 2114: first water hole; 2115: second water hole; 22: water passage cover plate; 23: sealing ring; 24: heat absorbing baseplate; 241: cooling fin assembly; 25: first connector; 26: second connector; 27: first pipe sleeve; 28: second pipe sleeve; 29: connector sealing ring; 31: water radiator panel; 32: pump; 33: lower casing; 34: upper casing; 35: anti-vibration sleeve; 36: liquid outlet pipe; 37: liquid inlet pipe; 221: drive motor; 222: impeller pipe; 223: impeller; and 224: water pump tee pipe.

DETAILED DESCRIPTION

With reference to FIGS. 1 to 7, the present application relates to a novel water cooling radiator with a detachable water pump and a built-in fan, including a liquid inlet pipe 37, a liquid outlet pipe 36, a pump 32, a cooling unit, a cooling fan unit and a heat absorbing unit tightly attached to a cooling surface of a processor, wherein the heat absorbing unit is internally provided with a heat absorbing cavity, as well as a liquid inlet pipe orifice 212 and a liquid outlet pipe orifice 211 which are communicated with the heat absorbing cavity. The cooling unit is communicated with the liquid inlet pipe orifice 212 of the heat absorbing unit through the liquid inlet pipe 37, the liquid outlet pipe orifice 211 of the heat absorbing unit is connected to an input end of the liquid outlet pipe 36 through the pump 32, and an output end of the liquid outlet pipe 36 is communicated with the cooling unit. The cooling fan unit includes a fan main body 13 and a cylindrical cooling housing 12 sleeved on the heat absorbing unit, wherein several air inlet holes 121 are formed in an outer side wall at an upper end of the cooling housing 12 along the circumferential direction, and several air outlet holes 122 are formed in an outer side wall at a lower end of the cooling housing 12 along the circumferential direction. The cooling housing 12 is sleeved on the heat absorbing unit, and the fan main body 13 is disposed on the surface of the heat absorbing unit and located between the height of the air inlet holes 121 and the height of the air outlet holes 122.

The specific structure of the heat absorbing unit in the present application will be described below. The heat absorbing unit includes a bottom case 21, a water passage cover plate 22 and a heat absorbing baseplate 24 which are connected successively from top down. The bottom case 21 is provided with a liquid outlet pipe orifice 211 and a liquid inlet pipe orifice 212. A first water cavity 2111 connected to the liquid inlet pipe orifice 212 and a second water cavity 2112 communicated with the liquid outlet pipe orifice 211 are defined by the liquid outlet pipe orifice 211 and the water passage cover plate 22, and are independent of each other. A third water cavity 2113 is defined by the heat absorbing baseplate 24 and the water passage cover plate 22, wherein a cooling fin assembly 241 is fixedly disposed on the surface of the heat absorbing baseplate 24 and in the third water cavity 2113. A first water hole 2114 for communicating the first water cavity 2111 with the third water cavity 2113 and a second water hole 2115 for communicating the third water cavity 2112 with the third water cavity 2113 are disposed in the surface of the water passage cover plate 22, wherein the first water hole 2114 extends along a direction perpendicular to the length of the cooling fin assembly 241, and the second water hole 2115 of the water passage cover plate 22 is disposed at a position corresponding to both ends of the cooling fin assembly 241.

When entering the first water cavity 2111 from the liquid inlet pipe orifice 212 and then entering the third water cavity 2113 from the first water hole 2114, the cooling liquid will enter gaps between a plurality of cooling fins in the cooling fin assembly 241, flow to both ends along a length direction of the cooling fin assembly 241, flow into the second water cavity 2112 from the second water hole 2115 and then flow to the cooling unit through the liquid outlet pipe orifice 211 as the cooling fin assembly 241 is disposed in the third water cavity 2113 and the first water hole 2114 extends along the direction perpendicular to the length of the cooling fin assembly 241, thus realizing water circulation. Therefore, it is ensured that the cooling liquid can be in contact with the plurality of cooling fins in the cooling fin assembly 241 to the maximum extent, thereby increasing the contact area between the cooling liquid and the cooling fin assembly 241 and improving the heat dissipation effect. At the same time, since the water flows from the first water cavity 2111 to the third water cavity 2113 and then to the second water cavity 2112, and the water in the whole water passage flows from top down and then flows out from bottom top, the level of the cooling liquid will definitely be higher than the height of the cooling fin assembly 241 and therefore the water circulation can be realized, thus ensuring the complete contact between the cooling liquid and the cooling fin assembly 241 and improving the heat dissipation effect.

While maintaining the most basic water cooling effect, the radiator according to the present application is further provided with a cooling fan unit. Several air inlet holes 121 are formed in an outer side wall at an upper end of the cooling housing 12 along the circumferential direction, and several air outlet holes 122 are formed in an outer side wall at a lower end of the cooling housing 12 along the circumferential direction. The cooling housing 12 is sleeved on the heat absorbing unit, and the fan main body 13 is disposed on the surface of the heat absorbing unit and located between the height of the air inlet holes 121 and the height of the air outlet holes 122. The radiator enables outside air to enter the cooling housing 12 from the air inlet holes 121 at the upper end of the cooling housing 12 and be discharged from the air outlet holes 122 at the lower end of the cooling housing 12. As the heat absorbing unit is tightly attached to the cooling surface of a CPU when in operation, the air discharged from the air outlet holes 122 can dissipate heat from and cool down various electronic components such as MOS tubes and memory chips around the motherboard and CPU. By using the radiator according to the present, the CPU and various electronic components such as MOS tubes and memory chips around it can be simultaneously cooled down, which can greatly improve the heat dissipation efficiency and prolong the service life of the motherboard.

According to the present application, a pump 32 is disposed between the cooling unit and the liquid outlet pipe 36. Compared with the traditional pump built in the heat absorbing unit, the pump 32 in the present application is connected externally to the radiator, which makes the installation, connection and maintenance more convenient and the performance better.

Preferably, a first notch 124 corresponding to the liquid outlet pipe orifice 211 and a second notch corresponding to the liquid inlet pipe orifice 212 are disposed at the lower end of the cooling housing. The cooling housing 12 is sleeved on the surface of the heat absorbing unit, the first notch 124 is sleeved at the liquid outlet pipe orifice 211, and the second notch is sleeved at the liquid inlet pipe orifice 212. The first notch 124 and the second notch are provided as a foolproofing design which facilitates the cooling housing 12 to be sleeved at the heat absorbing unit and plays the role of positioning and anti-deviation.

Preferably, the fan main body 13 includes fan blades 125, a drive motor and a cylindrical fan mounting sleeve 131. The drive motor is in drive connection with the fan blades 125 and drives the fan blades 125 to rotate, and a mounting bracket 1311, on which the drive motor is assembled, is disposed at a lower end of the fan mounting sleeve 131. Several connecting columns each having a first screw hole formed in its upper end, are disposed on the surface of the bottom case 21, and second screw holes aligned with the first screw holes are formed in the mounting bracket 1311. The fan mounting sleeve 131 is placed on the surface of the bottom case 21 and passes through the first screw hole and the second screw hole respectively through screws, so as to be assembled with the heat absorbing unit. Several support columns 210, top ends of which are propped against an bottom wall of the mounting bracket 1311, are further disposed on the surface of the bottom case 21, and the fan mounting sleeve 131 is placed on the surface of the bottom case 21. In the present application, the connecting columns and the mounting bracket 1311 are detachably assembled by screws to facilitate the installation or removal of the fan main body 13 and the bottom case 21. At the same time, the connecting columns and the support columns 210 can prop up the fan main body 13, so that a certain distance is kept between the fan main body 13 and the bottom case 21, and sufficient space is reserved for air out, thus improving the heat dissipation effect of the fan main body 13.

Preferably, an LED light module, consisting of a red LED light, a blue LED light, a green LED light and a white LED light, is disposed on an inner wall of the fan mounting sleeve 131. Users can connect the LED light module to an external control chip, so as to control the on or off and the turn-on mode of the LED lights by the control chip. For example, the control chip can control the LED light module to achieve different lighting effects according to different types of music.

Preferably, in order to facilitate users to watch the lighting effects of the LED light module, an opening, which is covered and closed by a cover plate 11 made of transparent material, is formed at an upper end of the cooling housing 12, and the cover plate 11 has a certain dust-proof effect. Therefore, the users can see the magic lighting effects of the fan through the upper opening and the lateral air holes of the cooling housing 12.

Preferably, in order to facilitate the placement of the cover plate 11, a lug boss 123, on a top wall of which the cover plate 11 is placed, is disposed around an inner wall of the opening.

Preferably, the radiator further includes a first connector 25, a second connector 26, a first pipe sleeve 27 and a second pipe sleeve 28. The first connector 25 is assembled at the liquid outlet pipe orifice 211, and the second connector 26 is assembled at the liquid inlet pipe orifice 212. The first connector 25 is communicated with the input end of the liquid outlet pipe 36 through the first pipe sleeve 27, an output end of the liquid outlet pipe 36 is communicated with a water inlet end of the pump 32, and a water outlet end of the pump 32 is communicated with the cooling unit. The cooling unit is communicated with an input end of the liquid inlet pipe 37, and the second connector 26 is communicated with an output end of the liquid inlet pipe 37 through the second pipe sleeve 28. Furthermore, in this embodiment, connector sealing rings 29 are provided at the joint between the first connector 2525 and the liquid outlet pipe 36 and at the joint between the second connector 26 and the liquid inlet pipe 37, which can enhance the air tightness of the liquid outlet pipe 36 and the liquid inlet pipe 37 to avoid leakage.

With reference to FIGS. 3 to 6, further, a sealing groove is disposed around the joint between the bottom case 21 and the heat absorbing baseplate 24, and a sealing ring 23 of which the cross-sectional area is greater than that of the sealing groove is embedded in the sealing groove. The sealing ring has a cross-sectional area greater than that of the sealing groove, which enhances the air tightness and reduces the probability of liquid leakage.

Preferably, the radiator further includes a pump casing. The pump casing includes an upper casing 34 and a lower casing 33, the pump 32 is located in a cavity defined by the upper casing 34 and the lower casing 33, and the liquid inlet pipe 37 is communicated with a water radiator panel 31 after passing through the cavity. In addition, the upper casing 34 and the lower casing 33 are fixed by upper and lower hooks without using screws.

Figure 7:
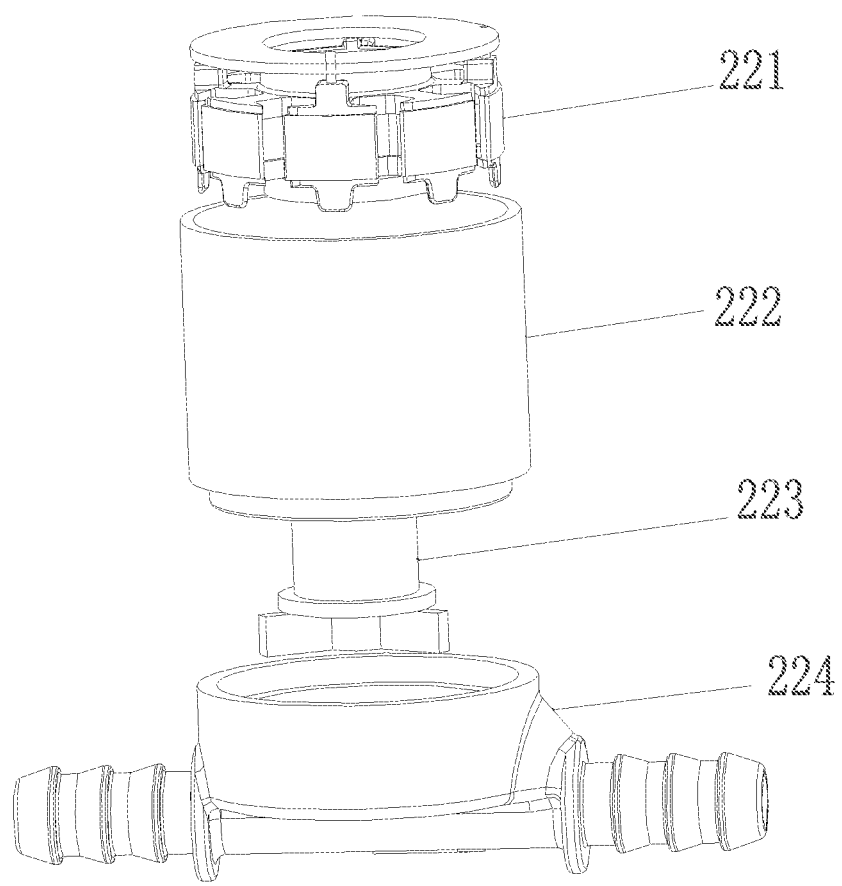
FIG. 7 is a structural diagram of a pump according to the present application.

With reference to FIG. 7, in the embodiment, the pump 32 includes an impeller pipe 222, a drive motor 221, an impeller 223 and a water pump tee pipe 224. The impeller pipe 222 is communicated with one end of the water pump tee pipe 224, the drive motor 221 and the impeller 223 are both disposed in the impeller pipe 222, and an output shaft of the drive motor 221 is connected to the impeller 223. The impeller 223 extends into the water pump tee pipe 224 along its length direction, and a water inlet end of the water pump tee pipe 224 is communicated with the liquid outlet pipe 36, and a water outlet end of the water pump tee pipe 224 is communicated with the cooling unit. Furthermore, an anti-vibration sleeve 35 is sleeved on the surface of the impeller pipe 222, so as to sleeve the water pump to prevent noise caused by the operation of the water pump and the vibration of the pump cover.

The above embodiments merely describe the preferred embodiments of the present application, and are not intended to limit the scope of the present application. Without departing from the spirit of the present application, various modifications and improvements made by those of ordinary skill in the art to the technical solution of the present application shall all fall within the protection scope defined by the claims of the present application.

The invention claimed is:

1. A novel water cooling radiator with a detachable water pump and a built-in fan, comprising a liquid inlet pipe, a liquid outlet pipe, a pump, a cooling unit, a cooling fan unit and a heat absorbing unit connected with a cooling surface of a processor, wherein the heat absorbing unit is internally provided with a heat absorbing cavity, as well as a liquid inlet pipe orifice and a liquid outlet pipe orifice which are communicated with the heat absorbing cavity; the cooling unit is communicated with the liquid inlet pipe orifice of the heat absorbing unit through the liquid inlet pipe, the liquid outlet pipe orifice of the heat absorbing unit is connected to an input end of the liquid outlet pipe through the pump, and an output end of the liquid outlet pipe is communicated with the cooling unit; the cooling fan unit comprises a fan main body and a cylindrical cooling housing, wherein several air inlet holes are formed in an outer side wall at an upper end of the cooling housing along a circumferential direction, and several air outlet holes are formed in an outer side wall at a lower end of the cooling housing along the circumferential direction; and the cooling housing is sleeved on the heat absorbing unit, and the fan main body is disposed on the surface of the heat absorbing unit and located between the air inlet holes and the air outlet holes.

2. The novel water cooling radiator with a detachable water pump and a built-in fan according to claim 1, wherein a first notch corresponding to the liquid outlet pipe orifice and a second notch corresponding to the liquid inlet pipe orifice are disposed at the lower end of the cooling housing; the cooling housing is sleeved on the heat absorbing unit, the first notch is sleeved at the liquid outlet pipe orifice, and the second notch is sleeved at the liquid inlet pipe orifice.

3. The novel water cooling radiator with a detachable water pump and a built-in fan according to claim 1, wherein the fan main body comprises fan blades, a drive motor and a cylindrical fan mounting sleeve; the drive motor is in drive connection with the fan blades and drives the fan blades to rotate, and a mounting bracket, on which the drive motor is assembled, is disposed at a lower end of the fan mounting sleeve; several connecting columns each having a first screw hole formed in its upper end, are disposed on the surface of the heat absorbing unit, and second screw holes aligned with the first screw holes are formed in the mounting bracket; and the fan mounting sleeve is placed on the surface of the heat absorbing unit and passes through the first screw holes and the second screw holes respectively through screws, so as to be assembled with the heat absorbing unit.

4. The novel water cooling radiator with a detachable water pump and a built-in fan according to claim 3, wherein several support columns, top ends of which are propped against a bottom wall of the mounting bracket, are further disposed on the surface, and the fan mounting sleeve is placed on the surface of the heat absorbing unit.

5. The novel water cooling radiator with a detachable water pump and a built-in fan according to claim 3, wherein an LED light module, consisting of a red LED light, a blue LED light, a green LED light and a white LED light, is disposed on an inner wall of the fan mounting sleeve.

6. The novel water cooling radiator with a detachable water pump and a built-in fan according to claim 1, wherein an opening, which is covered and closed by a cover plate made of transparent material, is formed at an upper end of the cooling housing.

7. The novel water cooling radiator with a detachable water pump and a built-in fan according to claim 6 wherein a lug boss, on a top wall of which the cover plate is placed, is disposed around an inner wall of the opening.

8. The novel water cooling radiator with a detachable water pump and a built-in fan according to claim 1 further comprising a first connector, a second connector, a first pipe sleeve and a second pipe sleeve, the first connector being assembled at the liquid outlet pipe orifice, and the second connector being assembled at the liquid inlet pipe orifice, wherein the first connector is communicated with the input end of the liquid outlet pipe through the first pipe sleeve, an output end of the liquid outlet pipe is communicated with a water inlet end of the pump, and a water outlet end of the pump is communicated with the cooling unit; and the cooling unit is communicated with an input end of the liquid inlet pipe, and the second connector is communicated with an output end of the liquid inlet pipe through the second pipe sleeve.

9. The novel water cooling radiator with a detachable water pump and a built-in fan according to claim 8, further comprising a pump casing, wherein the pump casing comprises an upper casing and a lower casing, the pump is located in a cavity defined by the upper casing and the lower casing, and the liquid inlet pipe is communicated with the cooling unit after passing through the cavity.

\* \* \* \* \*